(12) United States Patent
Kim et al.

(10) Patent No.: US 7,426,151 B2
(45) Date of Patent: Sep. 16, 2008

(54) DEVICE AND METHOD FOR PERFORMING A PARTIAL ARRAY REFRESH OPERATION

(75) Inventors: Jae-Hoon Kim, Kyungki-do (KR); Jae-Youn Youn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 230 days.

(21) Appl. No.: 11/459,896

(22) Filed: Jul. 25, 2006

(65) Prior Publication Data

US 2006/0256628 A1 Nov. 16, 2006

Related U.S. Application Data

(63) Continuation-in-part of application No. 10/999,354, filed on Nov. 29, 2004, now Pat. No. 7,102,936.

(51) Int. Cl.
*G11C 11/406* (2006.01)

(52) U.S. Cl. .................. 365/222; 365/226; 365/230.03

(58) Field of Classification Search ........................ None
See application file for complete search history.

(56) References Cited

U.S. PATENT DOCUMENTS

| | | | |
|---|---|---|---|
| 5,627,493 A | 5/1997 | Takeuchi et al. | |
| 5,781,494 A * | 7/1998 | Bae et al. | 365/230.03 |
| 5,804,893 A | 9/1998 | Fujioka | |
| 6,021,082 A | 2/2000 | Shirai | |
| 6,084,386 A | 7/2000 | Takahashi et al. | |
| 6,172,931 B1 * | 1/2001 | Cha et al. | 365/226 |
| 6,392,951 B2 | 5/2002 | Fujima et al. | |
| 6,496,438 B2 | 12/2002 | Saito | |
| 6,590,822 B2 * | 7/2003 | Hwang et al. | 356/222 |
| 6,704,237 B2 | 3/2004 | Park | |
| 2001/0010459 A1 | 8/2001 | Kobayashi et al. | |

* cited by examiner

*Primary Examiner*—Tan T. Nguyen
(74) *Attorney, Agent, or Firm*—Marger Johnson & McCollom, P.C.

(57) ABSTRACT

An internal voltage generator includes a control section and a switchable internal voltage generating circuit. The control section generates a control signal in response to a bank activation command and a bank activation signal for enabling memory banks. The internal voltage generating circuit receives a reference voltage, and responds to the control signal to output an internal voltage equal to the reference voltage. The control signal is enabled when the bank activation command and the bank activation signal are concurrently enabled. The bank activation signal is generated in response to a partial array self refresh (PASR) signal. The internal voltage may be supplied to banks selected by the bank PASR signal, thereby enabling refresh operations in the entire bank, or an internal voltage adequate to partially enable refresh operations in all the banks may be supplied. Thus, unnecessary power consumption may be effectively controlled.

13 Claims, 9 Drawing Sheets

DEVICE AND METHOD FOR PERFORMING A PARTIAL ARRAY REFRESH OPERATION

CROSS REFERENCE TO RELATED APPLICATIONS

This is a Continuation-In-Part application of co-pending U.S. patent application Ser. No. 10/999,354, filed 29 Nov. 2004, which was a divisional of U.S. patent application Ser. No. 10/217,799, filed 12 Aug. 2002, now U.S. Pat. No. 6,842,382, which claimed priority from Korean Patent Application No. 2001-0049038, filed 14 Aug. 2001.

BACKGROUND

1. Technical Field

This disclosure relates to semiconductor memory devices, and more particularly, to a circuit, device, and method for performing a partial array refresh operation.

2. Description of the Related Art

Recently, an internal voltage generating circuit for maintaining an internal power voltage at a predetermined level independent of an external power voltage has been used in semiconductor memory devices operating in the region of 3V to 6V to improve properties such as high-speed operation and low operating current. With the increased operating current drawn by semiconductor products that are designed to operate at a low supply voltage of 3.3V using an external voltage (EVC), semiconductor products solving these problems using an internal voltage generating circuit have been favored.

In a memory circuit, the internal voltage generating circuit includes an internal voltage generating circuit that is configured to supply an internal voltage to the memory array and an internal voltage generating circuit that is configured to supply an internal voltage to the peripheral circuits associated with the memory array.

The internal voltage generating circuit for the memory array supplies a predetermined voltage required for storing data in a memory array bank or for reading data from the memory array bank.

The internal voltage generating circuit for the peripheral circuits supplies a predetermined voltage required for operating peripheral circuits of an associated memory array bank, but not the memory array bank itself. For example, peripheral circuits may include decoders, input buffers, output buffers, and input and output lines.

The internal voltage generating circuit for the peripheral circuits includes a standby internal voltage generating circuit that operates continually after power is turned on and an active internal voltage generating circuit that operates only when the corresponding memory bank is enabled.

Figure 9:
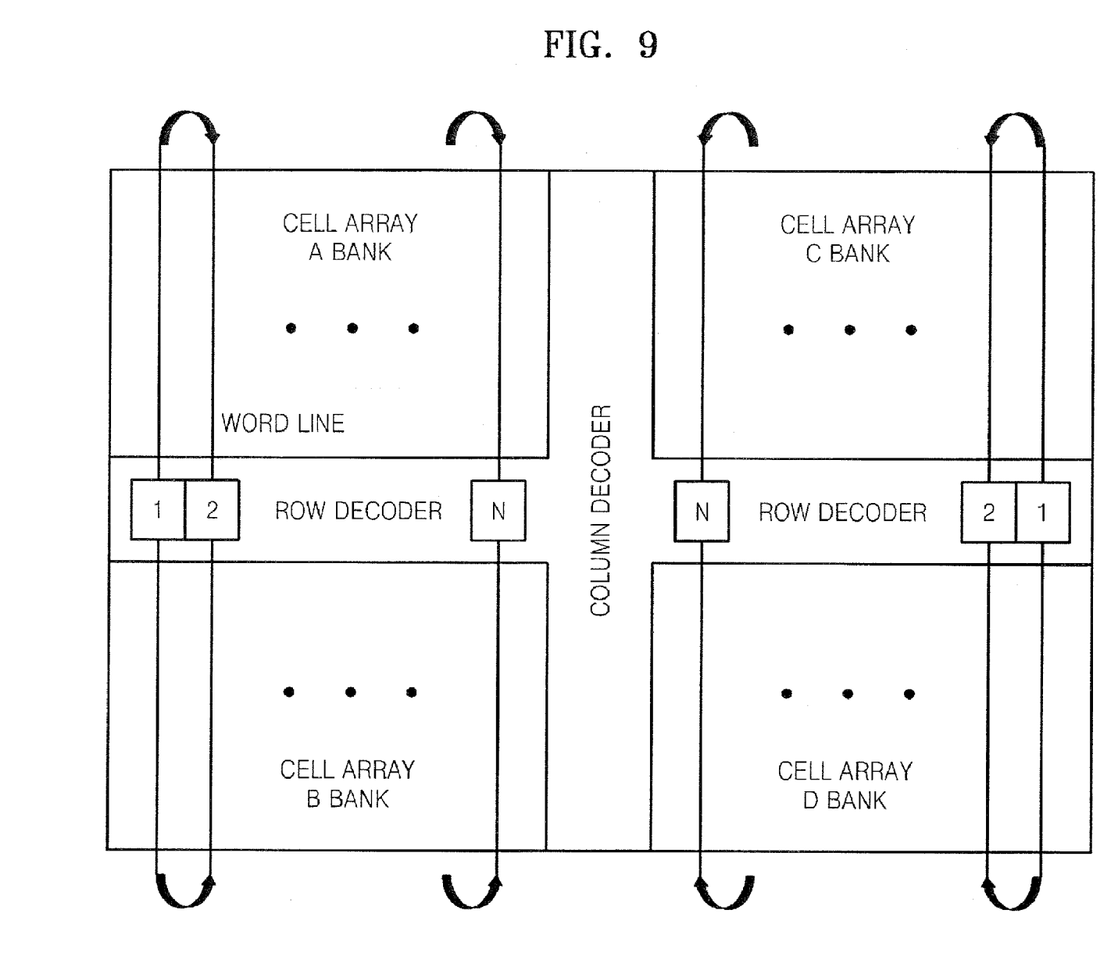
FIG. 9 is a simplified block diagram illustrating a conventional refresh operation in a semiconductor memory device.

FIG. 9 is a simplified block diagram illustrating a conventional refresh operation in a semiconductor memory device. In this conventional refresh operation, it may be assumed that a memory device 100 has a memory cell array that can be divided into four memory banks A, B, C and D, each bank having N word lines. Thus, in general, N refresh operations are concurrently performed on each of the four memory banks A, B, C and D. Each of the N word lines must be supplied with the appropriate voltage in order to perform read and write operations.

Embodiments of the invention address this and other disadvantages of the conventional art.

DETAILED DESCRIPTION OF EXAMPLE EMBODIMENTS

Figure 1:
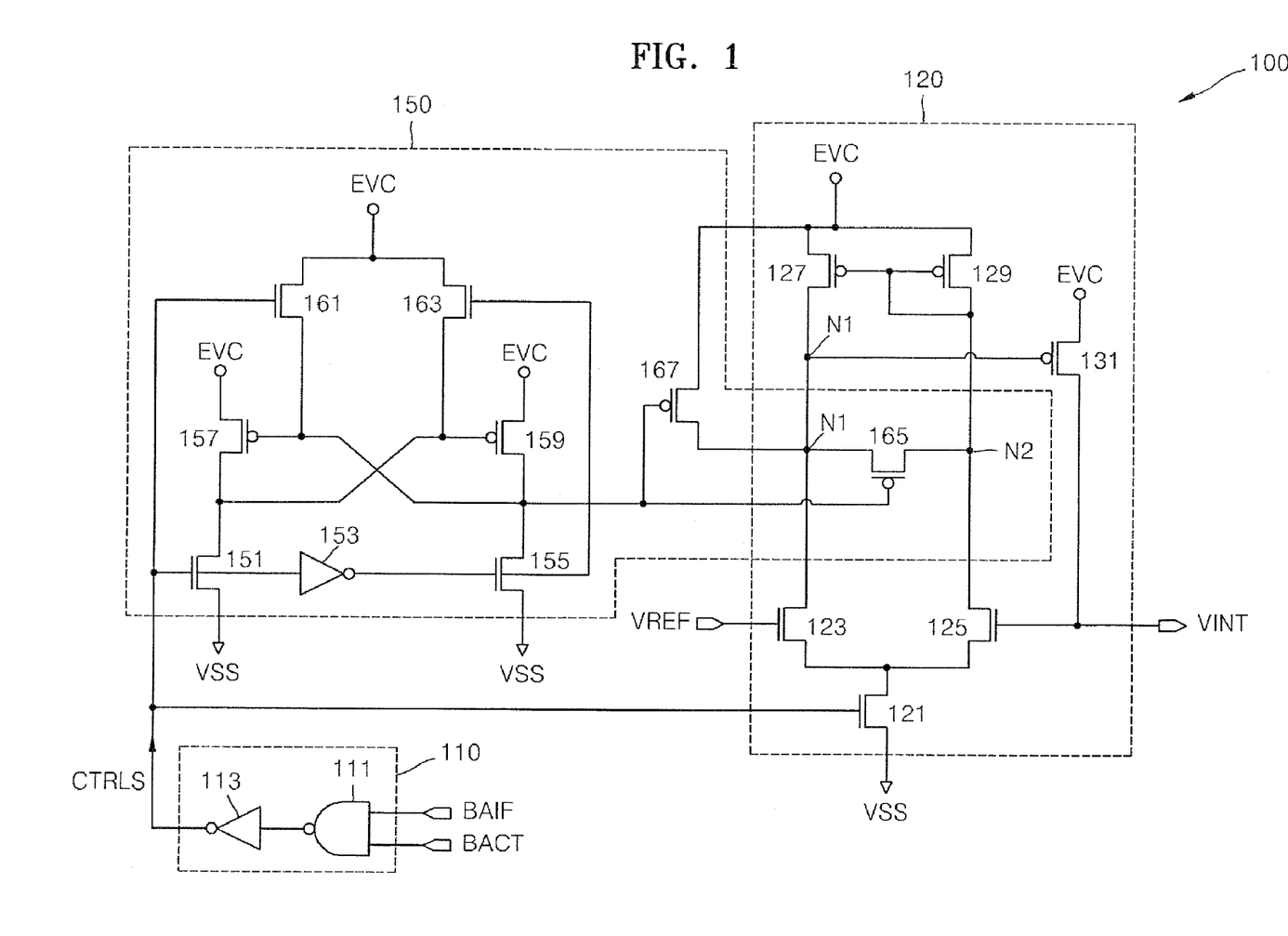
FIG. 1 is a circuit diagram illustrating an internal voltage generator according to some embodiments of the invention.

FIG. 1 is a circuit diagram illustrating an internal voltage generator 100 according to some embodiments of the invention. Referring to FIG. 1, the internal voltage generator 100 includes a control section 110 that is configured to generate a control signal CTRLS in response to a bank activation command BACT and a bank activation signal BAIF, which enables memory access to a given memory bank. The internal voltage generator 100 also includes a switchable internal voltage generating circuit 120 that is responsive to the control signal CTRLS. The switchable internal voltage generating circuit 120 receives a reference voltage VREF, and when activated, maintains an internal voltage VINT equal to the reference voltage VREF.

The control signal CTRLS is enabled when the bank activation command BACT and the bank activation signal BAIF are concurrently enabled.

The operation of the internal voltage generator 100 is described below with reference to FIG. 1.

The bank activation command BACT is an external command for enabling all the banks in a semiconductor memory device. After the bank activation command BACT is applied, selected ones of the enabled banks are activated in response to a Partial Array Self Refresh (PASR) signal, as further explained below.

Figure 3:
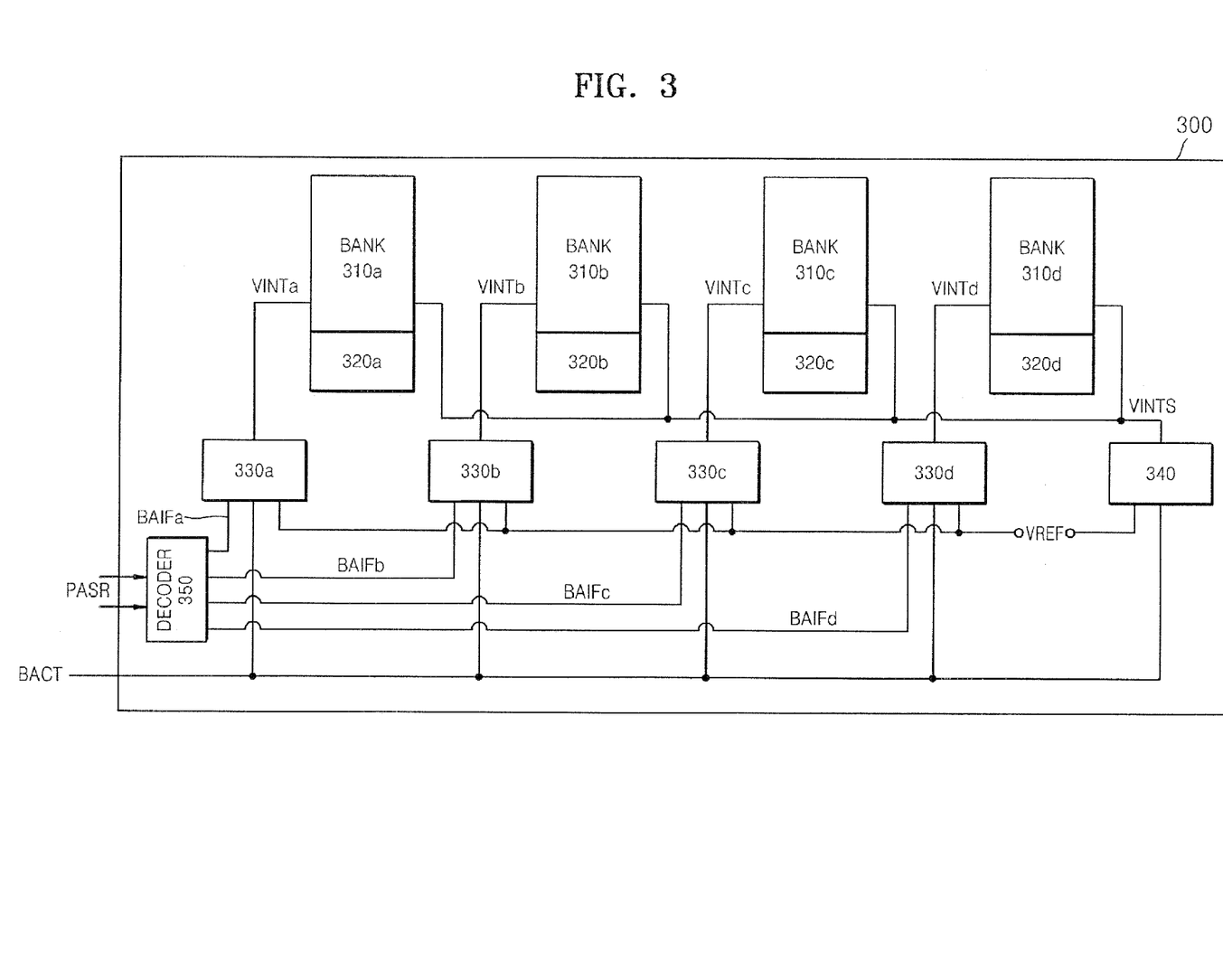
FIG. 3 is a simplified block diagram of a semiconductor memory device according to some embodiments of the invention.

Referring to FIG. 3, the bank activation signal BAIF is generated by a decoder 350 that is enabled when the Partial Array Self Refresh (PASR) signal is applied as input to the decoder. The bank activation signal BAIF may be enabled either to a high level or to a low level. That is, after memory banks have been placed in readiness for operation by receiving the bank activation command BACT, the bank activation signal BAIF is generated in response to the PASR signal and initiates supply of an internal voltage to selected memory banks.

Returning to FIG. 1, the controller 110 generates the predetermined control signal CTRLS in response to the bank activation command BACT and the bank activation signal BAIF. That is, when the bank activation command BACT and the bank activation signal BAIF are concurrently enabled, the control signal CTRLS is enabled and the internal voltage generating portion 120 is switched on.

More specifically, the controller 110 includes a NAND means 111 for performing an AND operation of the bank activation command BACT and the bank activation signal BAIF and inverting the result, and an inverter 113 for inverting the output of the NAND means 111 to control the control signal CTRLS. The inverter 113 inverts the output signal of the NAND means 111 and strengthens driving ability.

When the bank activation signal BAIF and the bank activation command BACT are enabled to a high level, the control signal CTRLS is generated at a high level. The controller 110 can be implemented as shown, and other alternative circuit implementations for enabling the control signal CTRLS when the bank activation command BACT and the bank activation signal BAIF are enabled will be apparent to those of skill in the art.

The internal voltage generating circuit 120 is structured to receive the reference voltage VREF, and responds to the enabled control signal CTRLS by outputting the internal voltage VINT, which is equal to the reference voltage VREF. The internal voltage generating circuit 120 may include a differential amplifier for receiving the reference voltage VREF.

The structure and operation of the internal voltage generating circuit 120 is described below with reference to FIG. 1.

The internal generating circuit 120 includes NMOS transistors 121, 123 and 125, and PMOS transistors 127, 129 and 131. The NMOS transistor 121 is configured to operate as a current source that maintains a constant current flow through the internal voltage generating circuit 120. The gate of the NMOS transistor 123 is tied to the reference voltage VREF, and the gate of the NMOS transistor 125 is tied to the internal voltage VINT output.

The gates of PMOS transistors 127 and 129 are commonly connected to each other as well as to the drain of the NMOS transistor 125, that is, to the voltage at the second node N2. When the drain voltage of the NMOS transistor 125 is at a high level, the PMOS transistors 127 and 129 are turned off. When the drain voltage of the NMOS transistor 125 is at a low level, the PMOS transistors 127 and 129 are turned on.

The gate of PMOS transistor 131 is connected to the drain of the NMOS transistor 123, that is, to the voltage at first node N1. When the drain voltage of the NMOS transistor 123 is at a high level, the PMOS transistor 131 is turned off. When the drain voltage of the NMOS transistor 123 is at a low level, the PMOS transistor 131 is turned on. An external voltage EVC is applied to the sources of the PMOS transistors 127, 129, and 131, and the source of the NMOS transistor 121 is connected to a ground voltage VSS.

The operation of the switchable internal voltage generating circuit 120 is as follows. Initially, the NMOS transistor 121 is turned off. When the control signal CTRLS is at a high level that is greater than the threshold voltage of the NMOS transistor 121, the NMOS transistor 121 is turned on. When the reference voltage VREF is applied and is greater than the threshold voltage of the NMOS transistor 123, the NMOS transistor 123 is turned on. The reference voltage VREF is set to be greater than the threshold voltage of the NMOS transistor 123. When the NMOS transistors 121 and 123 are turned on, the drain voltage of the NMOS transistor 123 is at a low level. Thus, the PMOS transistor 131 is turned on, and the internal voltage VINT is generated at the drain of the PMOS transistor 131.

When the internal voltage VINT increases and becomes greater than the reference voltage VREF, the NMOS transistor 125 is turned on more than the NMOS transistor 123. Then, a voltage generated at the drain of the NMOS transistor 125 is reduced to a low level. Thus, the PMOS transistors 127 and 129 are turned on more, and the drain voltage of the NMOS transistor 123 increases from a low level to a high level. Thus, the PMOS transistor 131 is turned on less. When the PMOS transistor 131 is turned on less, the internal voltage VINT, as the output of the internal voltage generating portion 120, is reduced, and thus, the NMOS transistor 125 is turned off less than the NMOS transistor 123. Then, the drain voltage of the NMOS transistor 123 is reduced, and the PMOS transistor 131 is turned on. Thus, the internal voltage VINT of the internal voltage generating circuit 120 increases.

By repeating the processed described above, the internal voltage VINT is maintained at a level equal to the reference voltage VREF as long as the reference voltage VREF is continuously applied.

The control signal CTRLS turns the NMOS transistor 121 on or off. Thus, the internal voltage generating circuit 120 operates only when the bank activation signal BAIF and the bank activation command BACT are enabled. That is, since only the internal voltage generator 100 selected by the PASR signal supplies the internal voltage VINT to the corresponding memory bank, unnecessary power consumption can be prevented.

As illustrated in FIG. 1, the internal voltage generator 100 also includes a level converter 150 for precharging the internal voltage generating circuit 120. The structure of the level converter 150 is described below.

The level converter 150 includes NMOS transistors 151, 155, 161 and 163, PMOS transistors 157, 159, 165 and 167, and an inverter 153. The PMOS transistor 157 and the NMOS transistor 151 are connected in series between the external voltage EVC and the ground voltage VSS. The PMOS transistor 159 and the NMOS transistor 155 are also connected in series between the EVC and the VSS. The gate of PMOS transistor 157 is connected to the drain voltage of the NMOS transistor 155, and the gate of PMOS transistor 159 is connected to the drain voltage of the NMOS transistor 151. The EVC is applied to the drains of the NMOS transistors 161 and 163, and the sources of the NMOS transistors 161 and 163 are connected to the gates of the PMOS transistors 157 and 159. The gates of NMOS transistors 151 and 161 are driven by the control signal CTRLS. The gates of NMOS transistors 155 and 163 are driven by the inverse of the control signal CTRLS, which is output from the inverter 153. The gates of PMOS transistors 165 and 167 are connected to the drain voltage of the NMOS transistor 155.

The operation of the level converter 150 is as follows. When the control signal CTRLS is at a low level, the NMOS transistor 155 is turned on, and the drain voltage of the NMOS transistor 155 is at a low level. Then, the PMOS transistor 157 is turned on, and the drain voltage of the NMOS transistor 151 is at a high level, and the PMOS transistor 159 is turned off. In such a case, the NMOS transistor 163 is turned on, and thus, the gate of the PMOS transistor 159 is fixed to a high level. The drain voltage of the NMOS transistor 155 is at a low level, and the PMOS transistors 165 and 167 are turned on. The turned-on PMOS transistors 165 and 167 precharge the first node N1 to the EVC and equalize the first node N1 and the second node N2 to the same EVC. The PMOS transistor 131, having a gate that is connected to the first node N1, is turned off. Since the control signal CTRLS is at a low level, the NMOS transistor 121 is turned off, and thus, the internal voltage generating circuit 120 does not operate.

Conversely, when the control signal CTRLS is enabled to a high level, the NMOS transistor 151 and the PMOS transistor 159 are turned on, and the PMOS transistors 165 and 167 are turned off. In this manner, the internal voltage generating circuit 120 becomes operational.

Due to the operation of the control section 120, the switchable internal voltage generating circuit 120, and the level converter 150 described above, the internal voltage generator 100 can supply the internal voltage VINT to cells of memory banks when those banks are selected, and unnecessary power consumption can be prevented.

Figure 2:
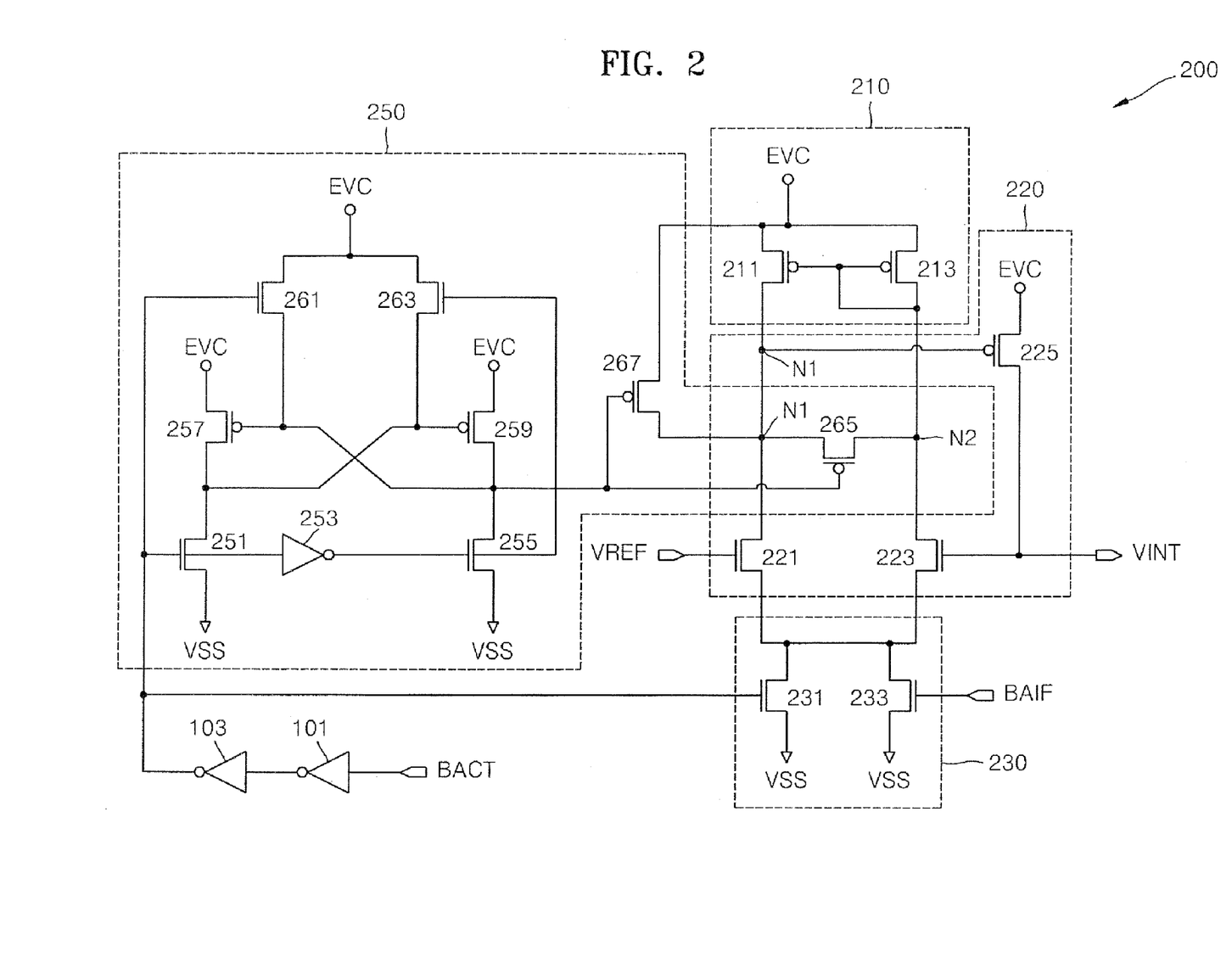
FIG. 2 is a circuit diagram illustrating another internal voltage generator according to some embodiments of the invention.

FIG. 2 is a circuit diagram illustrating another internal voltage generator 200 according to some embodiments of the invention. The internal voltage generator 200 includes a current mirror 210, a differential amplifier and input section 220, and a current sink 230.

The current mirror 210 is connected to an external voltage (EVC) and includes MOS transistors 211 and 213.

The differential amplifier and input section 220 includes MOS transistors 221, 223 and 225. The gate of MOS transistor 221 is connected to the reference voltage (VREF). The gate of MOS transistor 223 is connected to an internal voltage (VINT) output that is controlled to be equal to the reference voltage (VREF). The MOS transistor 225 is connected between the EVC and the gate of MOS transistor 223, and has a gate that is connected to one end of the MOS transistor 211.

The current sink 230 is controlled by a bank activation command BACT and a bank activation signal BAIF, and controls VINT in response to the bank activation signal BAIF. More specifically, the current sink 230 includes a MOS transistor 231 connected between a ground voltage VSS and one end of the MOS transistor 221, the MOS transistor 231 having a gate that is connected to the bank activation command BACT signal. The current sink also includes a MOS transistor 233 connected between the ground voltage VSS and one end of the MOS transistor 223, the MOS transistor having a gate that is connected to the bank activation signal BAIF. The MOS transistor 233 may be either an NMOS transistor or a PMOS transistor.

Referring to FIG. 2, the operation of the internal voltage generator 200 is as follows. Like the embodiments illustrated in FIG. 1, the bank activation command BACT is an external command for enabling all banks in a semiconductor memory device. Banks selected by the PASR signal of FIG. 3 are enabled after the bank activation command BACT is applied.

The bank activation command BACT is applied to the gate of the MOS transistor 231 through two inverters 101 and 103. The two inverters 101 and 103 strengthen the driving capability of the bank activation command BACT. As illustrated in FIG. 2, the MOS transistor 231 is an NMOS transistor, but in alternative embodiments it may be a PMOS transistor.

When the bank activation command BACT is applied at a high level, the NMOS transistor 231 is turned on, and thus, the internal voltage VINT is generated. The operation of the current mirror 210, the differential amplifier and input section 220, and the current sink 230 is similar to that of the switchable internal voltage generating circuit 120 that was described above with reference to FIG. 1. Thus, a detailed description is omitted to avoid unnecessary repetition.

When the bank activation signal BAIF is generated at a high level in response to the PASR signal, the NMOS transistor 233 is turned on. Then, the drain voltage of the NMOS transistor 231 is reduced more, and the PMOS transistor 225 can be turned on more. Thus, the range of power that is generated at the internal voltage VINT increases. That is, the power output from the internal voltage generator 200 is controlled by the bank activation signal BAIF. Thus, the amount of internal voltage VINT supplied to the memory banks may be controlled.

The internal voltage generator 200 further includes a level converter 250 for precharging the differential amplifier and input section 220. The structure and operation of the level converter 250 are the same as those described for the level converter 150 of FIG. 1. Thus, a detailed description of the structure and operation of the level converter 250 is omitted to avoid unnecessary repetition.

FIG. 3 is a simplified block diagram of a semiconductor memory device according to some embodiments of the invention. Referring to FIG. 3, device 300 includes a number of internal voltage generators 330a-d for supplying an internal voltage VINTa-d to a corresponding memory bank 310a-d in response to a bank activation command BACT and a predetermined bank activation signal BAIFa-d.

The semiconductor memory device also includes a decoder 350 for decoding an input partial array self refresh (PASR) signal and selecting the bank activation signals from BAIFa-d that correspond to the PASR, in order to generate one or more bank activation signals BAIFa-d to drive selected ones of the internal voltage generators 330a-d in response to the PASR signal. In alternative embodiments of the invention, the decoder need not be present and the PASR signal can be passed directly to the internal voltage generators 330a-d. The PASR signal may be set by a mode register set (MRS) signal.

In FIG. 3, the structure of each internal voltage generator 330a-d is the same as that of the internal voltage generator 100 of FIG. 1. Thus, a detailed description of the internal voltage generators 330a-d is omitted to avoid unnecessary repetition. In FIG. 3, each of the internal voltage generators 330a-d corresponds to each memory bank 310a-d, and supplies the internal voltage VINTa-d to the corresponding memory bank. The internal voltage generators 330a-d are turned on or off in response to the bank activation signals BAIFa-d generated by the PASR signal, thereby preventing unnecessary power consumption.

As shown in FIG. 3, the semiconductor memory device 300 may additionally include a secondary internal voltage generator 340 for supplying the internal voltage VINTS to memory banks 320a-d in response to the bank activation command BACT, thereby supplying secondary power when used together with the internal voltage generators 330a-d. The internal voltage generator 340 may have the same structure as the internal voltage generator 100 shown in FIG. 1, except that it does not receive the bank activation signal BAIF. Thus, a detailed description of the internal voltage generator 340 is omitted to avoid unnecessary repetition.

The internal voltage VINTS is supplied to the memory banks 310a-d by internal voltage generator 340, which operates in response to the bank activation command BACT. The internal voltage VINTa-d is supplied to memory banks 310a-d by the corresponding internal voltage generator 330a-d that operates in response to the bank activation signal BAIFa-d. Some or all of the memory banks 310a-d may be supplied with the corresponding internal voltage VINTa-d depending upon whether the corresponding bank activation signal BAIFa-d is enabled in response to the PASR signal that is input to the decoder 350.

Although the internal voltage generators 330a-d of FIG. 3 have been described as being implemented using the internal voltage generator 100 of FIG. 1, alternative embodiments of the invention may be implemented with the internal voltage generator 200 of FIG. 2. Other suitable internal voltage generators will be apparent to those of ordinary skill.

Figure 4:
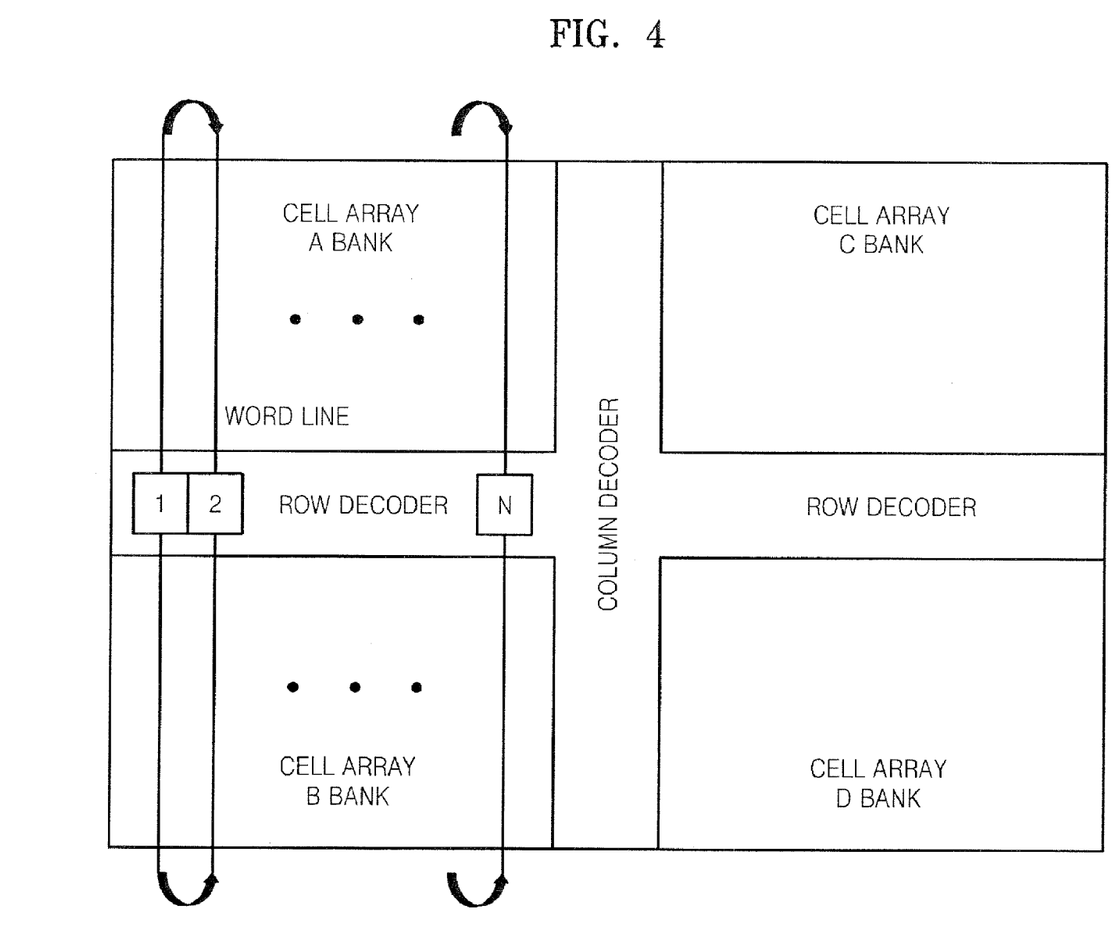
FIG. 4 is a diagram illustrating a method for refreshing selected memory banks in an array according to some embodiments of the invention.

FIG. 4 is a diagram illustrating a method for refreshing selected banks in an array according to some embodiments of the invention. According to this method, a number of internal voltage generators are associated with multiple memory banks, e.g., as shown in FIG. 3.

Referring to FIGS. 3 and 4, a bank activation command BACT and a PASR signal are received. The bank activation command BACT is an external signal for enabling all banks in a semiconductor memory device. When the banks are selected by the PASR signal after the bank activation command BACT is applied, the selected banks operate. According to these embodiments, selected internal voltage generators are switched on according to the state of BACT and PASR. For example, referring to FIG. 3, initially no voltage generators would be selected. When BACT is enabled, internal voltage generator 340 would be selected and would supply voltage VINTS to memory banks 310a-d. Then, when the PASR signal is decoded, decoder 350 enables, e.g., BAIFa and BAIFb, causing voltage generators 330a and 330b to supply internal voltages VINTa and VINTb to memory bank 310a and 310b, respectively. Thus, since half of the total number of internal voltage generators are enabled, a refresh operation may be performed on only half of the banks, as illustrated in FIG. 4.

Figure 5:
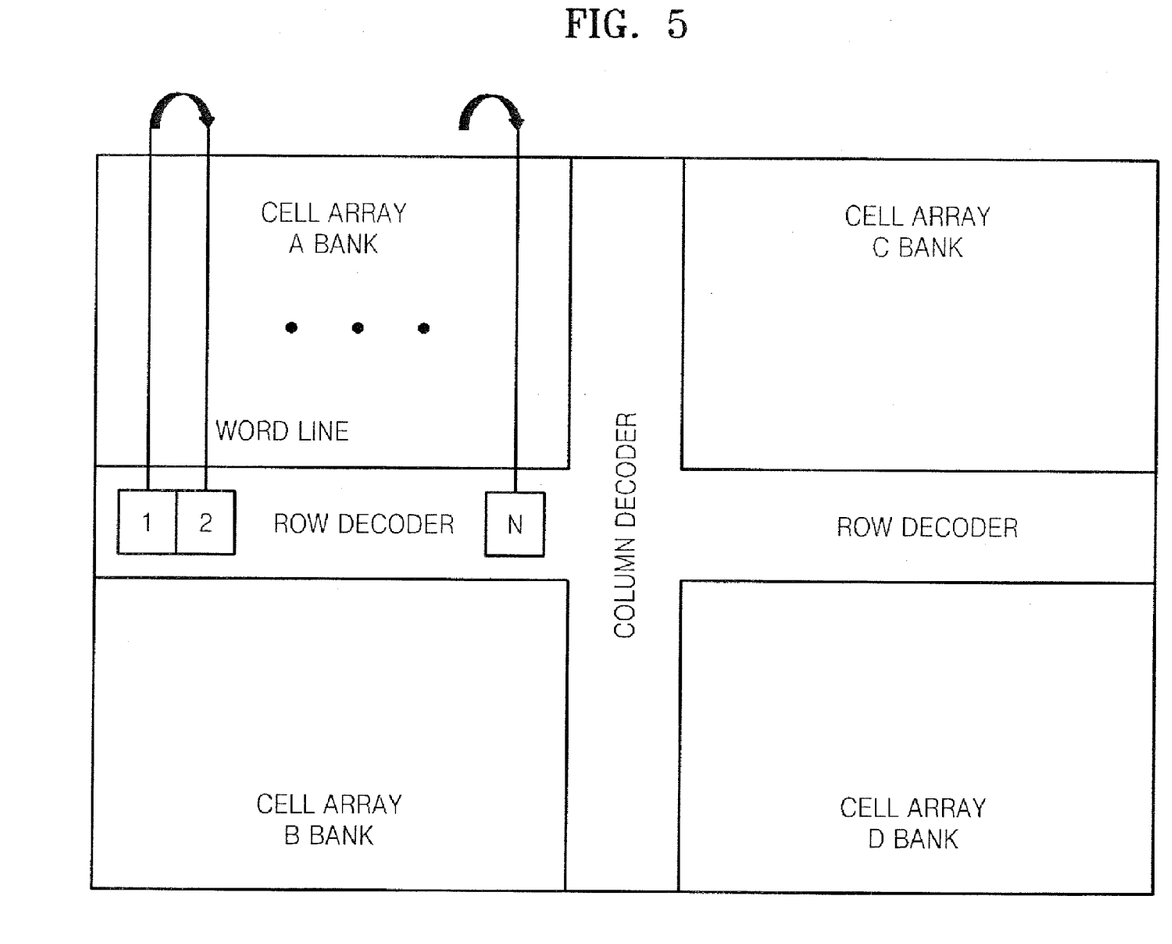
FIG. 5 is a diagram illustrating a method for refreshing selected memory banks in an array according to some other embodiments of the invention.

FIG. 5 is a diagram illustrating a method for refreshing selected banks in an array according to some other embodiments of the invention. Referring to FIGS. 3 and 5, the method illustrated in FIG. 5 is similar to that of FIG. 4 except that only one bank activation signal BAIFa has been enabled in response to the PASR signal. Thus, an internal voltage VINTa is supplied only to memory bank 310a. Therefore, a refresh operation may be performed on only one quarter of the banks, as illustrated in FIG. 5.

According to the embodiments illustrated in FIGS. 4 and 5, the internal voltage may be supplied only to memory banks that are selected for operation by the PASR signal, thereby preventing unnecessary power consumption.

Figure 6:
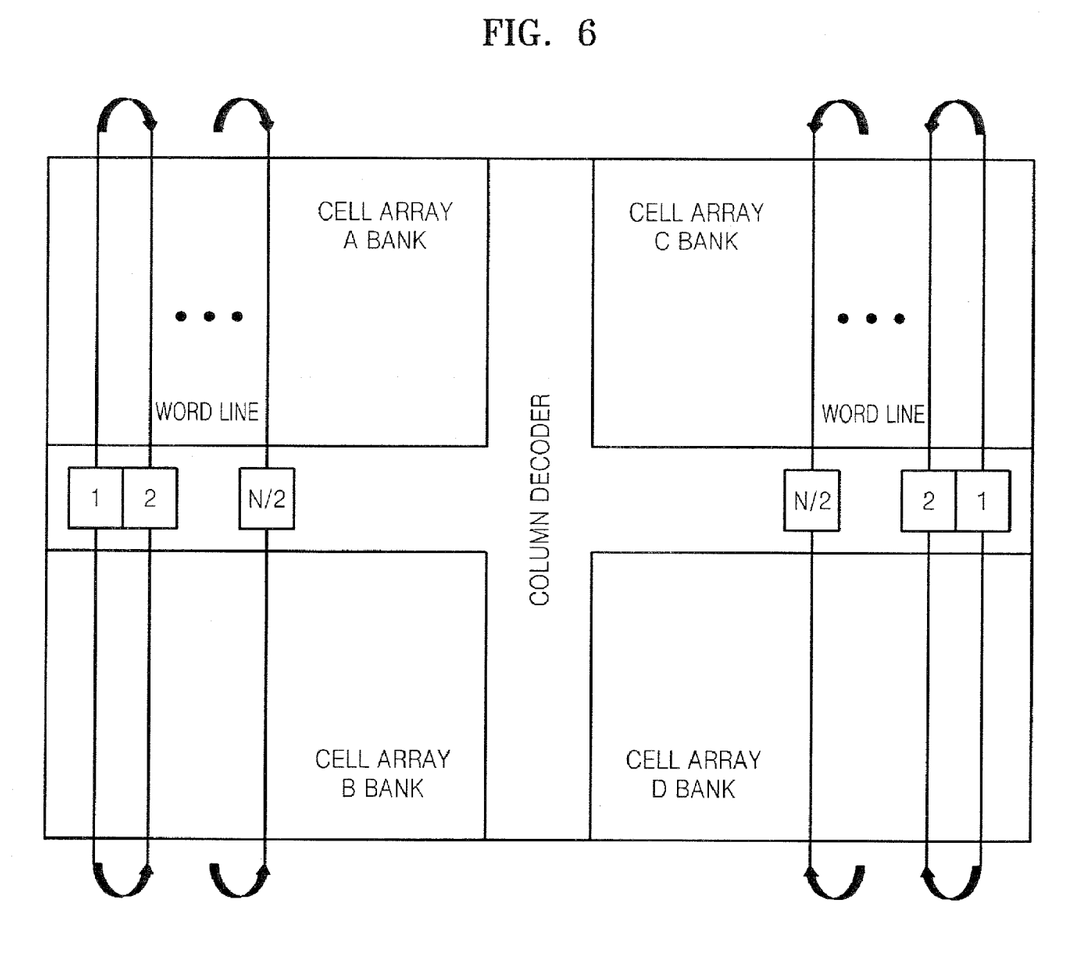
FIG. 6 is a diagram illustrating a method for refreshing a portion of all memory banks in an array according to more embodiments of the invention.

FIG. 6 is a diagram illustrating a method for refreshing a portion of all banks in an array according to more embodiments of the invention. According to these embodiments, it is assumed that the internal voltage generators 330a-330d of FIG. 3 are implemented using the internal voltage generator 200 of FIG. 2.

As was explained above with reference to FIG. 2, when the bank activation command BACT is applied at a high level, the NMOS transistor 231 is turned on, and thus, the internal voltage VINT is generated. Subsequently, when the bank activation signal BAIF generated in response to the PASR signal is applied at a high level, the NMOS transistor 233 is turned on. Then, the drain voltage of the NMOS transistor 231 is reduced more, and the PMOS transistor 225 can be turned on more. As a result, the power output from the internal voltage generator 200 is controlled by the bank activation signal BAIF.

According to the method illustrated in FIG. 6, for each of the internal voltage generators 330a-330d of FIG. 3, only one of the transistors 231 and 233 of FIG. 2 is turned on by controlling the bank activation command BACT and the bank activation signal BAIF. Thus, the internal voltage VINT generated by the internal voltage generator 200 is adequate to control only one-half of each of the banks 310a-310d, as illustrated in FIG. 6.

Figure 7:
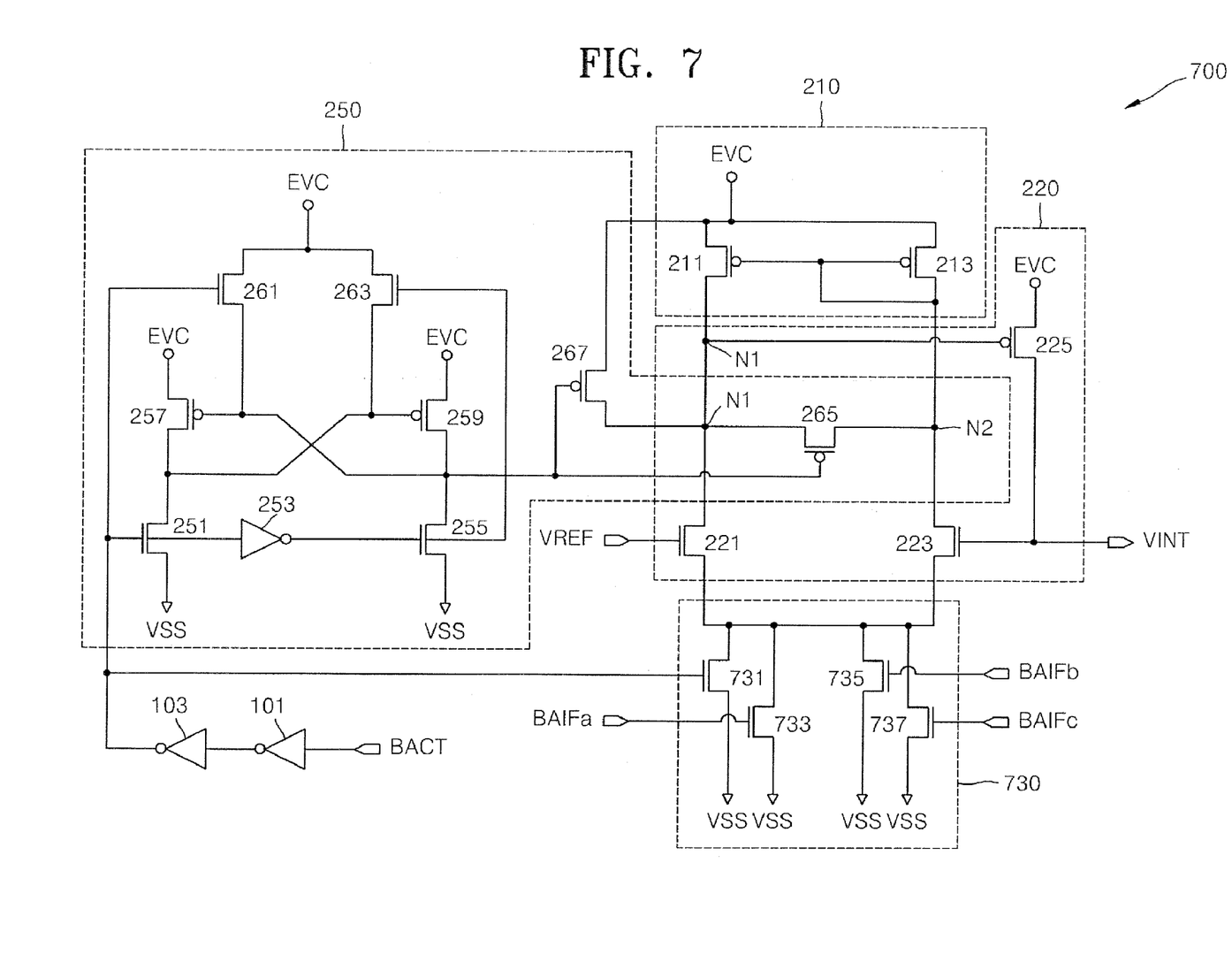
FIG. 7 is a circuit diagram illustrating still another internal voltage generator according to some embodiments of the invention.

FIG. 7 is a circuit diagram illustrating still another internal voltage generator 700 according to some embodiments of the invention. Since the current sink 730 of circuit 700 is the only portion of the circuit that is appreciably different from the internal voltage generator 200 of FIG. 2, only the current sink 730 of FIG. 7 is described in detail below. The other portions of the internal voltage generator 700 have a similar construction and operation as internal voltage generator 200 of FIG. 2, so those details will be omitted to avoid unnecessary repetition.

Rather than the two NMOS transistors exhibited by the current sink 230 of FIG. 2, the current sink 730 of FIG. 7 includes four NMOS transistors 731, 733, 735 and 737. Like NMOS transistor 231 of FIG. 2, the NMOS transistor 731 is controlled by the bank activation command BACT. However, the other three NMOS transistors 733, 735 and 737 are each controlled by one of the bank activation signals BAIFa, BAIFb and BAIFc.

If the internal voltage generator 700 of FIG. 7 were used to implement the four internal voltage generators 330a-d of FIG. 3, then it should be apparent that three of the four bank activation signals BAIFa-d should be used as inputs for each of the four internal voltage generators.

Figure 8:
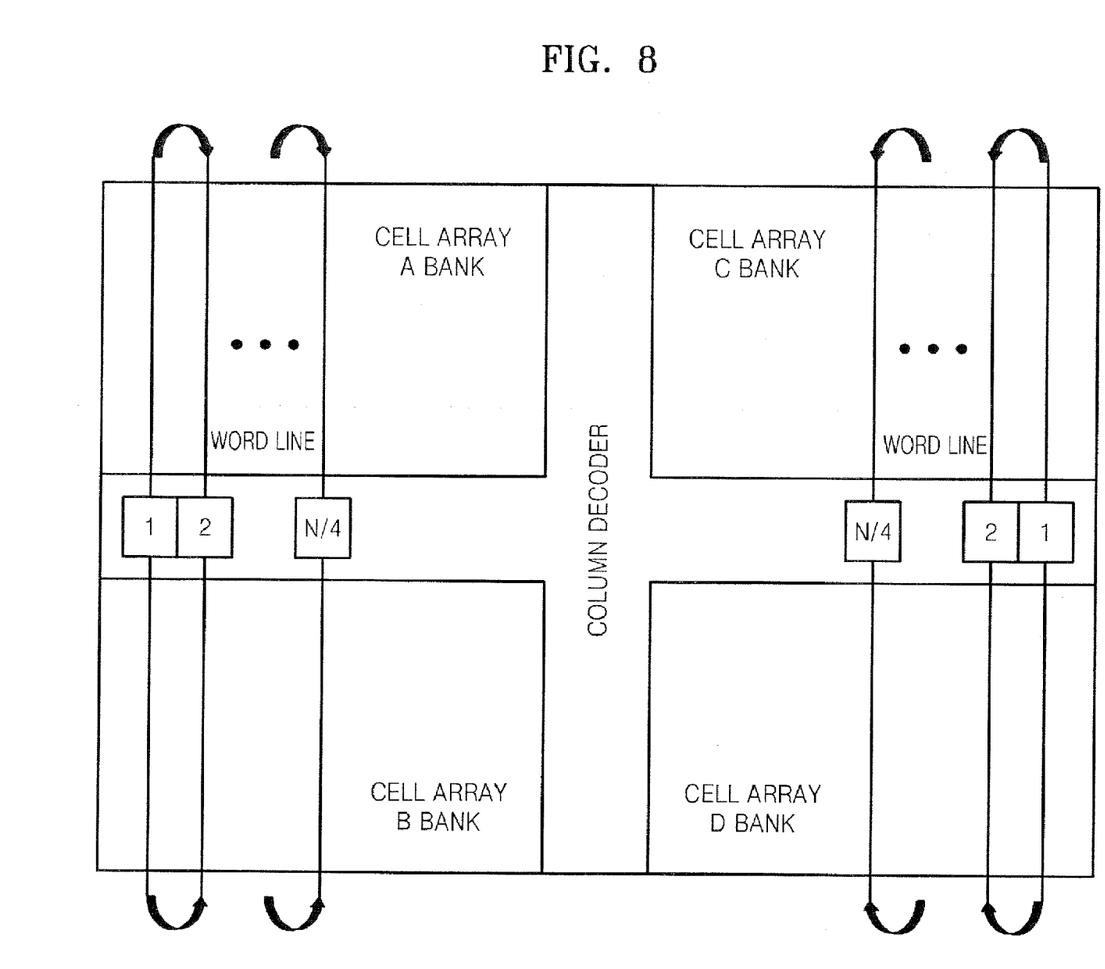
FIG. 8 is a diagram illustrating a method for refreshing a portion of all memory banks in an array according to different embodiments of the invention.

FIG. 8 is a diagram illustrating a method for refreshing a portion of all banks in an array according to different embodiments of the invention. According to these embodiments, it is assumed that the internal voltage generators 330a-330d of FIG. 3 are implemented using the internal voltage generator 700 of FIG. 7, with the appropriate modifications to FIG. 3 that were indicated in the immediately preceding paragraph.

According to the method illustrated in FIG. 8, for each of the internal voltage generators 330a-330d of FIG. 3, only one of the transistors 731, 733, 735 and 737 of FIG. 7 is turned on by controlling the bank activation command BACT and the bank activation signal BAIF. Thus, the internal voltage VINT generated by the internal voltage generator 200 is adequate to control only one-fourth of each of the banks 310a-310d, as illustrated in FIG. 8.

According to the embodiments illustrated in FIGS. 6 and 8, an internal voltage adequate to perform refresh operations on a portion of all banks in an array is supplied, thereby preventing unnecessary power consumption, effectively controlling the internal voltage, and always properly supplying the internal voltage.

While this invention has been particularly shown and described with reference to particular preferred embodiments, it will be understood by those skilled in the art that various changes in form and details may be made to the particular embodiments described above without departing from the spirit and scope of the invention as defined by the appended claims.

For example, while the exemplary embodiments of the invention described above were limited to the case where only four memory banks exist in a semiconductor memory device, it should be apparent that the inventive concepts described can be used in conjunction with devices having more or fewer than four memory banks.

The invention claimed is:

1. A semiconductor device comprising:
   memory banks; and
   internal voltage generators, each memory bank configured to receive an internal voltage output generated by a corresponding one of the internal voltage generators, each internal voltage generator configured to be operated alone or concurrently with other internal voltage generators depending on a state of a partial array self refresh (PASR) signal, wherein each internal voltage generator includes a control section configured to switch on the internal voltage generating circuit in response to a bank activation command and a bank activation signal, the bank activation signal responsive to the PASR signal.

2. The semiconductor device of claim 1, each internal voltage generator further comprising:
   a switchable internal voltage generating circuit having a reference voltage input, the switchable internal voltage generating circuit configured to maintain the internal voltage output at a level equal to the reference voltage input.

3. The semiconductor device of claim 2, further comprising a decoder configured to generate the bank activation signal in response to the PASR signal.

4. The semiconductor device of claim 2, the switchable internal voltage generating circuit comprising a differential amplifier configured to receive the reference voltage input.

5. The semiconductor device of claim 4, the differential amplifier arranged in a current mirror configuration.

6. A semiconductor device comprising:
   memory banks; and
   internal voltage generators, each memory bank configured to receive an internal voltage output generated by a corresponding one of the internal voltage generators, the level of the internal voltage output dependent on a state of a partial array self refresh (PASR) signal, and a decoder configured to generate the at least one bank activation signal in response to the PASR signal.

7. The semiconductor device of claim 6, each internal voltage generator comprising:
   a current mirror circuit that is connected to an external voltage;
   a differential amplifier circuit configured to generate the internal voltage output; and
   a current sink circuit configured to control the level of the internal voltage output in response to a bank enable signal and at least one bank activation signal.

8. The semiconductor device of claim 7, the current sink circuit comprising at least two MOS transistors, a gate of one of the at least two MOS transistors coupled to the bank enable signal and a gate of another one of the at least two MOS transistors coupled to the at least one bank activation signal.

9. The semiconductor device of claim 7, further comprising a level converter configured to precharge the differential amplifier circuit.

10. A method for supplying an internal voltage to memory cells of a semiconductor device having switchable internal voltage generators, the memory cells grouped into memory banks, the method comprising:
    associating at least one of the switchable internal voltage generators with each memory bank;
    controlling the switchable internal voltage generators with a partial array self refresh (PASR) signal such that a refresh operation is performed on a portion of the memory cells, and selecting which, if any, internal voltage generators to switch on, depending on the state of a bank activation command and the PASR signal.

11. The method of claim 10, wherein controlling the switchable internal voltage generators comprises:
    switching on the selected switchable internal voltage generators to supply the internal voltage to the memory bank associated with the selected switchable internal voltage generator.

12. The method of claim 10, wherein controlling the switchable internal voltage generators comprises:
    controlling a current sink portion of the switchable internal voltage circuits such that the internal voltage generated by the switchable internal voltage generators is adequate to perform refresh operations on a portion of the memory cells in each of the memory banks.

13. The method of claim 12, wherein controlling the current sink portion comprises turning MOS transistors off and on depending on the state of a bank activation command and the PASR signal.

* * * * *